United States Patent
Siniaguine et al.

[11] Patent Number: 6,095,582
[45] Date of Patent: Aug. 1, 2000

[54] ARTICLE HOLDERS AND HOLDING METHODS

[75] Inventors: Oleg Siniaguine, Santa Cruz; John Jacques, San Jose, both of Calif.

[73] Assignee: TruSi Technologies, LLC, Sunnyvale, Calif.

[21] Appl. No.: 09/041,284

[22] Filed: Mar. 11, 1998

[51] Int. Cl.⁷ .................................................. B66C 1/02
[52] U.S. Cl. ........................................ 294/64.3; 414/941
[58] Field of Search ............................... 294/64.3, 64.1, 294/64.2; 271/97, 98, 195; 901/40; 414/941

[56] References Cited

U.S. PATENT DOCUMENTS

| | | | |
|---|---|---|---|
| 3,425,736 | 2/1969 | Benjamin | 294/64.3 |
| 3,438,668 | 4/1969 | Olsson et al. | |
| 3,466,079 | 9/1969 | Mammel | |
| 3,523,706 | 8/1970 | Logue | |
| 3,539,216 | 11/1970 | Forcier | |
| 4,002,254 | 1/1977 | Olofsen | 214/300 |
| 4,029,351 | 6/1977 | Apgar et al. | |
| 4,118,058 | 10/1978 | Rahn et al. | |
| 4,257,637 | 3/1981 | Hassan et al. | |
| 4,474,397 | 10/1984 | Hassan et al. | 294/64.3 |
| 4,508,161 | 4/1985 | Holden | 165/1 |
| 4,566,726 | 1/1986 | Correnti et al. | 294/64.3 |
| 4,603,466 | 8/1986 | Morley | 29/569 R |
| 4,969,676 | 11/1990 | LaMagna | 294/64.3 |
| 5,022,695 | 6/1991 | Ayers | |
| 5,067,762 | 11/1991 | Akashi | 294/64.3 |
| 5,077,888 | 1/1992 | Tokisue et al. | |
| 5,080,549 | 1/1992 | Goodwin et al. | |
| 5,169,196 | 12/1992 | Safabakhsh | |
| 5,238,499 | 8/1993 | van de Ven et al. | 118/724 |
| 5,262,029 | 11/1993 | Erskine et al. | 204/298.15 |
| 5,324,155 | 6/1994 | Goodwin et al. | |
| 5,368,645 | 11/1994 | Bok | 118/500 |
| 5,370,709 | 12/1994 | Kobayashi | 29/25.01 |
| 5,445,677 | 8/1995 | Kawata et al. | 118/724 |
| 5,492,566 | 2/1996 | Sumnitsch | |
| 5,513,668 | 5/1996 | Sumnitsch | |
| 5,542,559 | 8/1996 | Kawakami et al. | 216/67 |
| 5,556,147 | 9/1996 | Somekh et al. | 901/40 |
| 5,578,532 | 11/1996 | van de Ven et al. | 437/245 |
| 5,590,996 | 1/1997 | Thompson et al. | |
| 5,632,873 | 5/1997 | Stevens et al. | 204/298.15 |
| 5,692,873 | 12/1997 | Weeks et al. | 414/627 |
| 5,697,427 | 12/1997 | Ngan et al. | 165/80.1 |
| 5,954,072 | 9/1999 | Matusita | 414/941 |

FOREIGN PATENT DOCUMENTS

| | | | |
|---|---|---|---|
| 0 295 785 A1 | 12/1988 | European Pat. Off. | |
| 0 807 964 A1 | 11/1997 | European Pat. Off. | |
| 0269826 | 11/1987 | Japan | 294/64.3 |
| 402156651 | 6/1990 | Japan | 294/64.3 |
| 02 303047 | 11/1990 | Japan | |
| 02 303047 | 12/1990 | Japan | H01L 21/68 |
| 404341438 | 11/1992 | Japan | 294/64.3 |
| 537924 | 2/1977 | U.S.S.R. | |
| 1732398 | 5/1992 | U.S.S.R. | 414/941 |
| WO 96/21943 | 7/1996 | WIPO | |
| WO 97/16847 | 5/1997 | WIPO | |
| WO 97/45862 | 12/1997 | WIPO | |

OTHER PUBLICATIONS

IBM Technical Disclosure Bulletin, vol. 13, No. 7, Dec. 1970, "Wager Holder" by Stegner.

IBM Technical Disclosure Bulletin, vol. 18, No. 6, Nov. 1975, "Orienting Bernoulli Effect Wafer transfer Mechanism" by Burg et al.

*Primary Examiner*—Dean J. Kramer
*Assistant Examiner*—Paul T. Chin
*Attorney, Agent, or Firm*—Skjerven, Morrill, MacPherson, Franklin & Friel LLP; Michael Shenker

[57] ABSTRACT

An article holder generates a gas flow (for example, a vortex) to hold the article at a predetermined distance from the body of the holder. Pins extend from the body of the holder and physically contact an article surface to impede the article movement along the surface. As a result, the article is prevented from bumping against the locator pins surrounding the article when the holder accelerates.

4 Claims, 3 Drawing Sheets

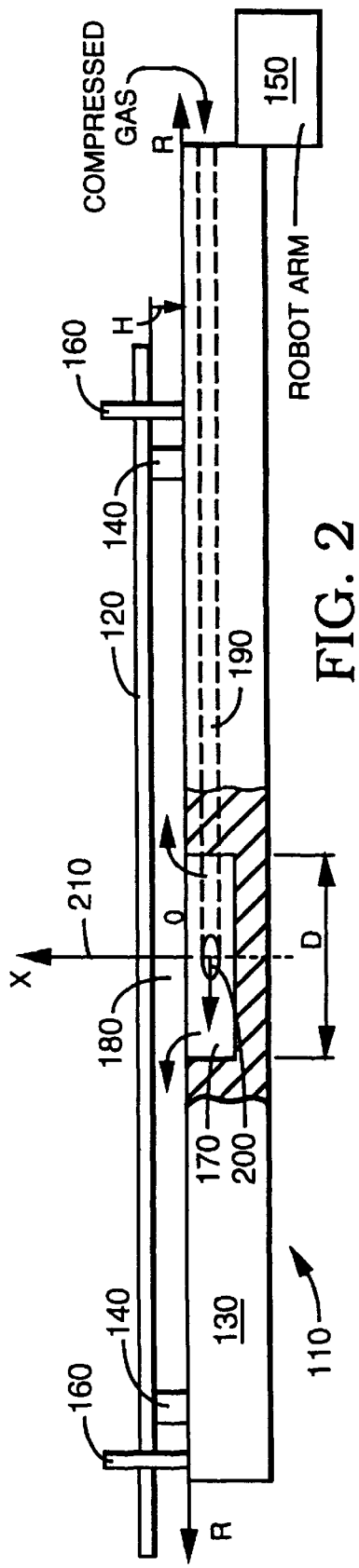
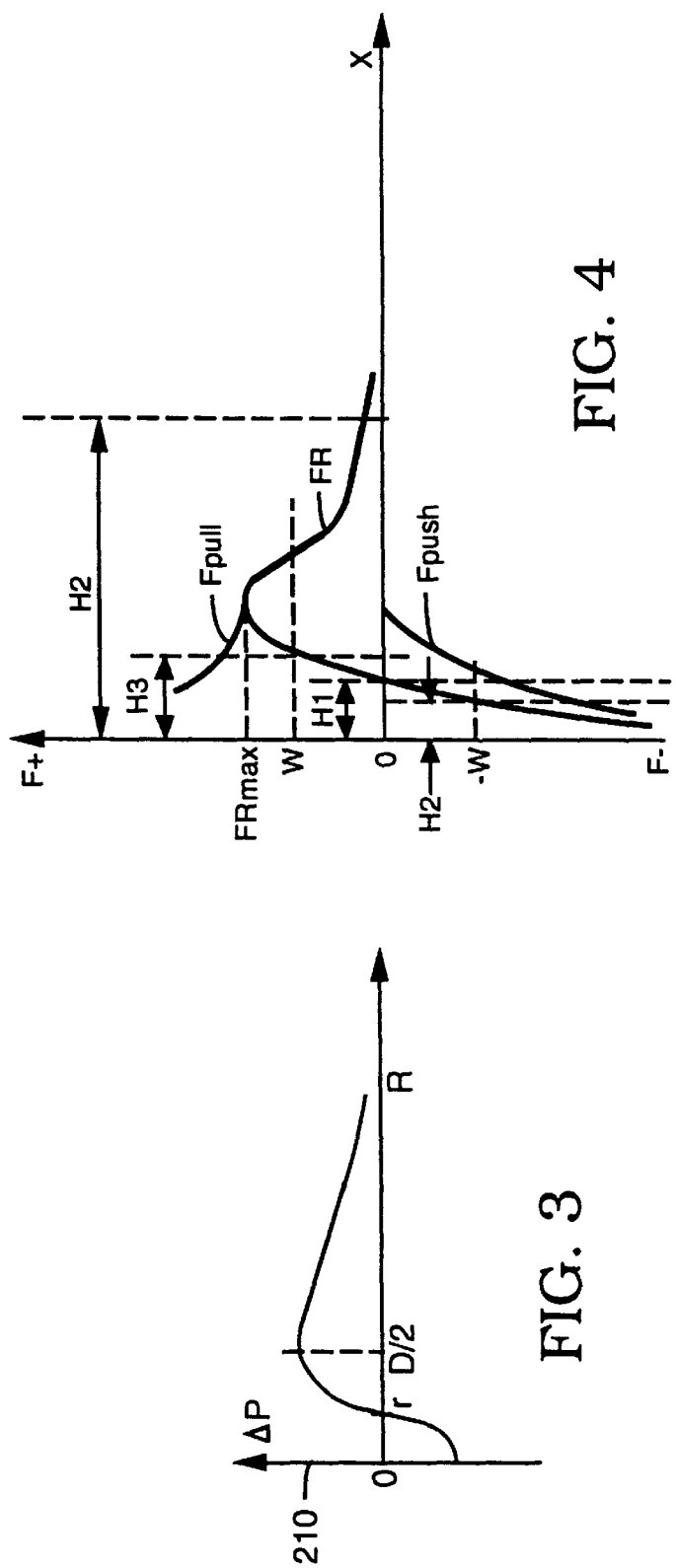
FIG. 2
FIG. 3
FIG. 4

ARTICLE HOLDERS AND HOLDING METHODS

CROSS REFERENCE TO RELATED APPLICATIONS

Not applicable.

STATEMENT REGARDING FEDERALLY SPONSORED RESEARCH

Not applicable.

BACKGROUND OF THE INVENTION

The present invention relates to article holders and holding methods.

Article holders are widely used to hold articles in a suitable manner. For example, in semiconductor industry, wafer holders hold semiconductor wafers when the wafers are transported between wafer storage cassettes and wafer processing equipment. To reduce or eliminate wafer scratching and contamination, wafer holders are designed so as not to allow the wafer useful area to contact the holder. The wafer rests on holder support pins which contact the wafer only at the wafer periphery reserved for wafer handling, away from the wafer useful area.

Alternatively, a wafer is held in position by a gas vortex emitted by the holder or by a gas flow generating a reduced pressure between the holder and the wafer according to the Bernoulli principle. Such holders also do not contact the wafer useful area.

Improved holders and holding methods for wafers and other articles are desirable.

SUMMARY

The inventor has observed that in wafer holders in which the wafer periphery rests on support pins, the wafer sags in the middle. As a result, the wafer useful area in the middle may undesirably contact the holder, at least when the holder accelerates. In some cases the support pins cannot be made sufficiently high to prevent such contact because the height of the support pins is limited by other pieces of equipment interacting with the holder, for example, by the height of slots reserved for individual wafers in wafer cassettes.

Further, wafer sagging introduces tension forces in the wafer. The wafer can be damaged by the tension forces.

Of note, sagging becomes a particularly serious problem as wafer diameters increase and as wafers reach smaller and smaller thicknesses during integrated circuit manufacturing.

Holders using gas flow also have problems. In such holders, the wafer is surrounded by vertical locator pins that prevent the wafer from sliding horizontally relative to the holder. The distance between the locator pins typically exceeds the average wafer size in order to accommodate slight variations in wafer sizes. Consequently, the wafer may bump against the locator pins. As a result, the wafer edges can get chipped and the wafer peripheral handling area and even the wafer useful area can be damaged. The danger of chipping is especially great for thin wafers.

In some embodiments of the present invention, the above disadvantages are reduced or eliminated as follows. One or more gas flows are generated adjacent to a wafer surface. In some embodiments, gas flows are similar to prior art vortices or Bernoulli effect gas flows, and they hold the wafer at a predetermined distance relative to the holder. In addition, one or more members (e.g. pins) contact the wafer surface at which the gas flows are generated. These "friction" members (e.g., "friction" pins) exert friction forces at the wafer surface to prevent the wafer from sliding horizontally relative to the holder. If locator pins are provided around the wafer, the friction pins prevent the wafer from bumping against the locator pins.

In some embodiments, the friction pins contact the wafer only in the wafer peripheral handling area.

In some embodiments, gas flow is not used to develop a vacuum holding the wafer but is used to reduce or eliminate wafer sagging when the wafer rests on the friction pins.

The invention also provides holders for articles other than semiconductor wafers.

Other features of the invention are described below. The invention is defined by the appended claims.

BRIEF DESCRIPTION OF THE DRAWINGS

FIG. 2 is a side view of the system of FIG. 1.

FIG. 3 is a graph of the pressure difference between the pressure near the wafer and the ambient pressure in the system of FIGS. 1 and 2.

FIG. 4 is a graph of forces acting on the wafer in the system of FIGS. 1 and 2.

DESCRIPTION OF PREFERRED EMBODIMENTS

Figure 1:
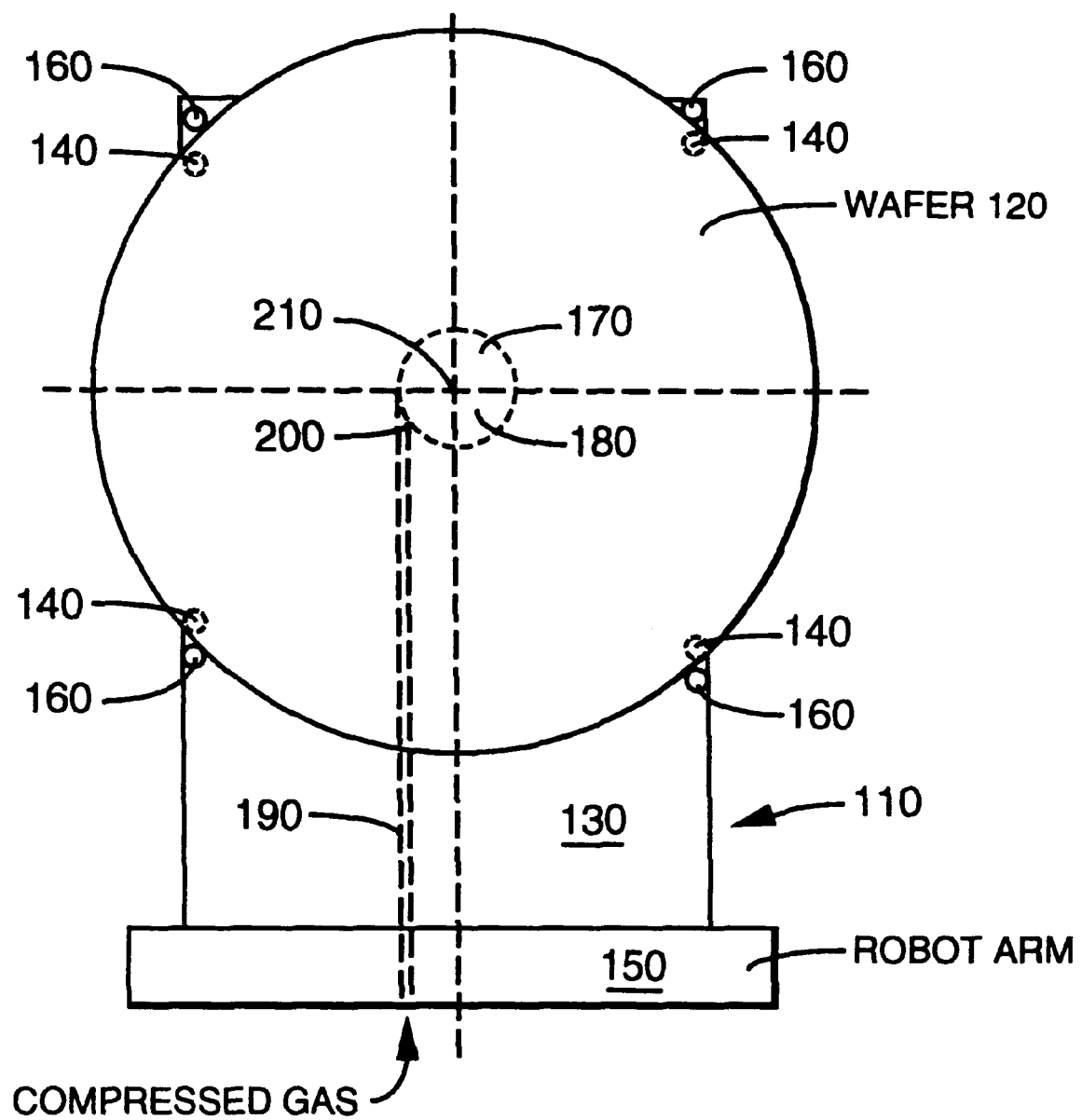
FIG. 1 is a top view of a system including a wafer holder of the present invention.

FIG. 1 is a top view showing a holder 110 holding a semiconductor wafer 120. FIG. 2 is a view from the left of the structure of FIG. 1. Holder 110 includes a flat platform 130 positioned below the wafer. Friction pins 140 extend from platform 130 and contact the horizontal bottom surface of the wafer in the wafer peripheral area reserved for wafer handling. In some embodiments, this area extends all around the wafer and has a width of about 3 mm. No useful circuits are manufactured in that area.

In some embodiments, the pins 140 contact the interior portion of the wafer bottom surface and, possibly, the surface edge. The pin top surface may extend beyond the wafer edge.

Friction pins 140 impede the horizontal movement of the wafer.

In some embodiments, only one pin 140 is provided. In other embodiments, three or more pins are provided and placed so that the wafer is in horizontal equilibrium.

Platform 130 is attached to an arm 150 of a robot or some other manipulator. In case of a robot, holder 110 is the robot end-effector. In some embodiments, the robot transports wafers between a cassette (not shown) and a wafer processing chamber (not shown) such as described, for example, in PCT application WO 96/21943 (Jul. 18, 1996) or U.S. patent application Ser. No. 08/975,403 "Plasma Processing Methods and Apparatus" filed Nov. 20, 1997 by O. Siniaguine, both of which are incorporated herein by reference.

Vertical locator pins 160 surround the wafer. Pins 160 extend from platform 130 up and above the wafer and also restrict the lateral wafer movement relative to the holder. The height of pins 160 is greater than the height of friction pins 140. Locator pins 160 may or may not touch the wafer because the distance between the locator pins is chosen to accommodate slight variations in wafer sizes. Friction pins 140 prevent the wafer from bumping against the locator pins.

In some embodiments, locator pins 160 are replaced by a solid rim. In other embodiments, the locator pins and the rim are omitted.

Gas flow generator 170 in platform 130 generates a gas flow that reduces the pressure in a region 180 between the platform 130 and the wafer. Generator 170 is a cylindrical chamber closed from the bottom but open from the top. Channel 190 delivers compressed gas from the robot to opening 200 in a vertical wall of chamber 170. Channel 190 is tangential to the chamber wall. The compressed gas (for example, air) emerging from opening 200 creates a gas vortex in chamber 170. The gas vortex reduces the pressure in region 180.

The pressure profile is illustrated in FIG. 3. For any point between wafer 120 and platform 130, the horizontal coordinate R in the graph of FIG. 3 is the distance between the point and vertical axis 210 passing through the center of chamber 170. The vertical coordinate $\Delta P$ is the difference between the pressure at the point and the ambient pressure. "D" denotes the diameter of chamber 170 (about 6 mm in some embodiments), and "r" denotes the radius of cylindrical region 180. r<D/2.

In region 180 (R<r), the negative pressure difference $\Delta P$ creates a "vacuum" force Fpull (FIG. 4) which draws the wafer towards the platform 130. In FIG. 4, Fpull is shown positive. The horizontal coordinate X is the distance between the wafer and the platform 130.

The gas leaving the chamber 170 flows radially away from chamber 170 and increases pressure outside the region 180, i.e. for R>r. Hence, when R>r, the pressure difference $\Delta P$ is positive. The positive pressure difference creates an "expelling" force Fpush that pushes the wafer away from platform 130. Fpush is shown negative in FIG. 4.

The resulting force FR=Fpull+Fpush is zero at some distance X=H1 between the wafer and the platform. For X<H1, |Fpull|<|Fpush| (Fpull is less than Fpush in magnitude), and hence the wafer is pushed away from platform 130 back to equilibrium position X=H1. For X>H1, |Fpull|>|Fpush| (Fpull is greater than Fpush in magnitude), and the wafer is pulled toward the platform 130 back to the equilibrium position X=H1. Thus, the point X=H1 is a stable equilibrium.

The equilibrium position X=H1 is determined above without taking the wafer weight into account. The actual equilibrium position X=H2 is lower than H1 (see FIG. 4) because the wafer weight pulls the wafer down below H1. In FIG. 4, the equilibrium position H2 is the value of coordinate X at a point at which the resulting force FR crosses the horizontal line F=−W where W is the wafer weight.

If the wafer is positioned below the platform 130 (in an embodiment in which locator pins 160 and the friction pins 140 extend downward from the platform), the equilibrium position is X=H3 (FIG. 4). This is the smallest X value at which the resulting force FR intersects the horizontal line F=W. In this case, the gas flow rate is chosen so that the maximum value FRmax of resulting force FR is greater than W.

In some embodiments, the size of chamber 170, the size of the transversal cross section of channel 190, and the gas flow rate are adjusted to keep the equilibrium distance H (i.e., H2 or H3) in the range of 0.1–1.0 mm. The chamber and channel sizes and the gas flow rate can be adjusted experimentally since the force FR±W can be measured by a force meter or a load cell using methods known in the art. In some embodiments, the diameter of chamber 170 is about 15 mm, the cross section of channel 190 is 0.5 mm, and the gas flow rate is 3 liters/min. The wafer diameter is 200 mm, and the wafer weight is 55 grams.

The height of friction pins 140 is set to the equilibrium distance H. Thus, the friction pins extend substantially only to the equilibrium position of the wafer. Therefore, the wafer does not sag.

Vacuum force Fpull presses the wafer 120 against the friction pins 140 when the robot arm accelerates away from the wafer. This reduces or eliminates bouncing of wafer 120 on friction pins 140. This in turn reduces contamination by particles that could be transferred from friction pins 140 to the wafer surface.

In some embodiments, the friction between the pins 140 and the wafer is increased by making the pins 140 taller than the equilibrium height H. The pins resist the wafer assuming the equilibrium position X=H. The wafer sags slightly, but the height of pins 140 is chosen to limit sagging to a level at which there is no significant risk that the wafer might break or that the wafer useful area might contact the platform 130.

Figure 5:
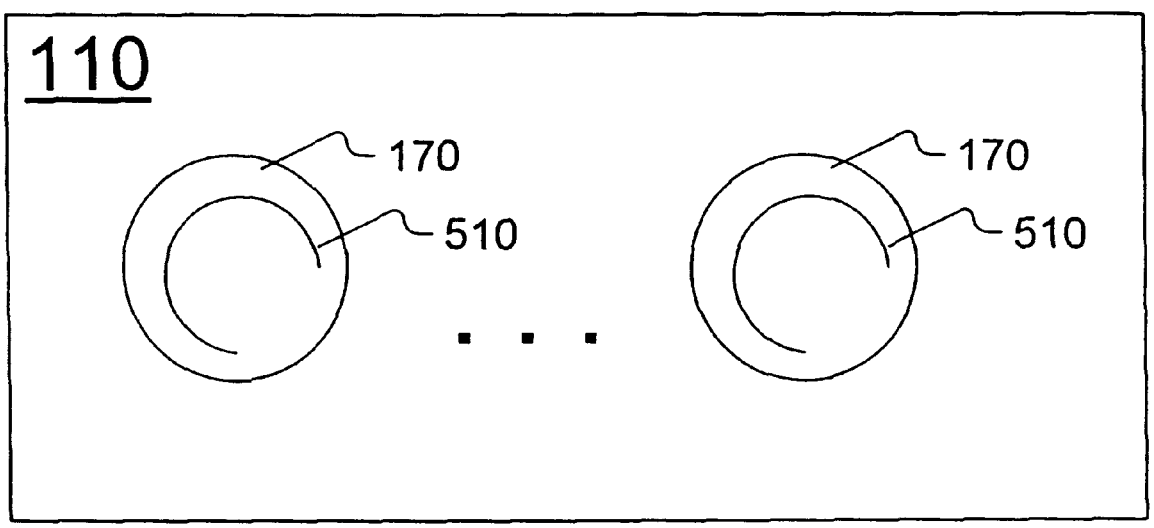
FIG. 5 is a schematic representation of a wafer holder of the present invention.

Some embodiments include more than one gas flow generator. FIG. 5 illustrates schematically multiple gas flow generatores 170 which generate respective multiple gas flows 510. In some embodiments, one or more gas flow generators 170 are of the type described in PCT publication WO 97/45862 "Non-Contact Holder for Wafer-Like Articles" published Dec. 4, 1997. In some embodiments, one or more gas flow generators are based on the Bernoulli principle.

In some embodiments, no vacuum force is generated. Compressed gas flow creates an expelling force at the wafer surface facing the holder (e.g. near the center of the wafer) to reduce or eliminate wafer sagging. The wafer is positioned above the holder on pins 140, and is held down by its weight.

Some holder embodiments hold semiconductor dies, flat panels, or other kinds of articles.

The embodiments described above illustrate but do not limit the invention. The invention is not limited by the shape or dimensions of friction pins or any other members. The pins 140 can be rigid or semi-rigid. Other embodiments and variations are within the scope of the invention, as defined by the appended claims.

What is claimed is:

1. An article holder in combination with the article, the article holder comprising:

one or more gas flow generators for generating one or more gas flows adjacent to a surface of the article;

one or more locator members for being positioned laterally adjacent to an edge of the article so as to restrict lateral movement of the article relative to the holder; and one or more friction members each of which is to physically contact an interior portion of said surface so that friction between said one or more friction members and said surface impedes article movement relative to the holder and thus impedes the article from bumping against the locator members, wherein at least one friction member is not to contact the edge of the article;

wherein the one or more gas flows are to develop one or more forces to force the article surface into a predetermined position relative to the holder; and at least one friction member extends beyond said predetermined position to resist the article surface assuming said predetermined position and thus to increase friction between the friction member and said surface.

2. An article holder in combination with the article, the article holder comprising:

one or more gas flow generators for generating one or more gas flows adjacent to a surface of the article;

one or more locator members for being positioned laterally adjacent to an edge of the article so as to restrict lateral movement of the article relative to the holder; and one or more friction members each of which is to physically contact an interior portion of said surface so that friction between said one or more friction members and said surface impedes article movement relative to the holder and thus impedes the article from bumping against the locator members, wherein at least one friction member is not to contact the edge of the article;

wherein the one or more gas flows are to develop one or more forces to force the article surface to be positioned at a predetermined distance from a body of the holder; and at least one friction member extends from the body of the holder by more than said predetermined distance to resist the article surface positioning at said predetermined distance from the body of the holder and thus to increase friction between the friction member and the article surface.

3. A method for holding an article, the method comprising:

positioning the article so that an edge of the article is adjacent to one or more locator members that restrict lateral movement of the article, and so that an interior portion of an article surface contacts one or more friction members that impede the article movement and impede the article from bumping against the one or more locator members, and at least one friction member does not contact the edge of the article; and generating one or more gas flows that generate one or more article holding forces transverse to said surface;

wherein the one or more gas flows bias the article surface towards a position at a predetermined distance from a body of a holder that emits the one or more gas flows towards the article; and at least one friction member extends from the body of the holder by more than said predetermined distance to resist the article surface positioning at said predetermined distance and thus to increase friction between the friction member and the article surface.

4. An article holder in combination with the article, the article holder comprising:

one or more friction members extending towards a region to be occupied by an article so as to contact a surface of the article at an interior portion of the surface of the article, the one or more friction members being for restricting lateral movement of the article along said article surface; and one or more vortex outlets for emitting one or more gas vortices towards the article surface, the gas vortices being to hold the article in the holder so that the one or more friction members contact the article at the interior portion of the surface of the article, wherein the one or more gas vortices develop one or more forces which, together with a weight of the article, define a stable equilibrium position for the article; and at least one friction member extends from the holder farther than said equilibrium position to resist the article assuming said equilibrium position and thus to increase friction between the friction member and the article surface.

* * * * *